United States Patent
Yamamoto

(10) Patent No.: US 7,264,998 B2
(45) Date of Patent: Sep. 4, 2007

(54) METHOD OF REMOVING UNNECESSARY MATTER FROM SEMICONDUCTOR WAFER, AND APPARATUS USING THE SAME

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 242 days.

(21) Appl. No.: 11/029,351

(22) Filed: Jan. 6, 2005

(65) Prior Publication Data
US 2005/0148156 A1 Jul. 7, 2005

(30) Foreign Application Priority Data
Jan. 7, 2004 (JP) .............................. 2004-001745

(51) Int. Cl.
*H01L 21/44* (2006.01)
(52) U.S. Cl. ...................... 438/115; 438/106; 438/455; 257/E21.499
(58) Field of Classification Search ................ 438/115
See application file for complete search history.

(56) References Cited

U.S. PATENT DOCUMENTS 5,961,768 A * 10/1999 Tsujimoto .................. 156/285
2005/0061425 A1 * 3/2005 Yamamoto .................. 156/250
2006/0089004 A1 * 4/2006 Yamamoto .................. 438/710

FOREIGN PATENT DOCUMENTS

JP 2002-124494 A1 4/2002

* cited by examiner

*Primary Examiner*—Michael Lebentritt
*Assistant Examiner*—Cheung Lee
(74) *Attorney, Agent, or Firm*—Rader, Fishman & Grauer PLLC

(57) ABSTRACT

In an unnecessary matter removal method of joining a separation tape onto a semiconductor wafer and, then, separating the separation tape from the semiconductor wafer, thereby separating an unnecessary matter on the semiconductor wafer together with the separation tape, the separation tape is separated from the semiconductor wafer in such a manner that an edge member is brought into contact with the separation tape joined to the semiconductor wafer, and a tip end of the edge member is pressed to the semiconductor wafer at a separation completion end portion where the unnecessary matter is separated from the wafer.

9 Claims, 14 Drawing Sheets

METHOD OF REMOVING UNNECESSARY MATTER FROM SEMICONDUCTOR WAFER, AND APPARATUS USING THE SAME

BACKGROUND OF THE INVENTION (1) Field of the Invention

The invention relates to a method of removing an unnecessary matter such as a protective tape or a resist film from a surface of a semiconductor wafer by means of a separation tape.

(2) Description of the Related Art

In a fabrication process of a semiconductor wafer (hereinafter, simply referred to simply as "wafer"), at the time when a back face of the wafer, that has been previously patterned, is ground (back grinding), a wide protective tape is joined beforehand onto the wafer surface. The protective tape projected from an outer periphery of the wafer is cut out along an outer diameter of the wafer. The wafer with the whole surface thereof covered by the protective tape is suction-held by a sucker from the surface and, then, is subjected to a grinding process. After that, the protective tape necessary no longer is removed from the wafer surface.

A method of separating the protective tape uses a separation tape. According to this method, a separation tape having an adhesion higher than that of the protective tape is joined to the protective tape (unnecessary matter) on the wafer surface using a roller rolled thereon. After that, the separation tape is wound off, so that the protective tape is separated together with the separation tape. Upon separating and removing the unnecessary protective tape by the separation tape from the wafer thinned in the back grinding process, the separation tape cannot be joined up to the end of the protective tape and the protective tape cannot be separated in stable manner. In view of this, there has been proposed a method of separating and removing the protective tape using an edge member (JP-A 2002-124494).

In recent years, however, trend is an increased rate at which bumps are formed on the surface of the semiconductor chip. In the case where the protective tape is separated from the wafer formed with the bumps on the surface thereof by the method described in JP-A 2002-124494, the wafer surface may be damaged. Also, friction between the edge member and the separation tape may generate foreign matters. In view of this, the present inventor has made vigorous efforts to solve this problem by separating the protective tape with the edge member moved upward and has come to know the new problem that the protective tape is slid in a lateral direction immediately before leaving the wafer end and the adhesive surface of the protective tape rubs the wafer surface, with the result that the wafer surface is contaminated.

SUMMARY OF THE INVENTION

The invention has been made in view of the above circumstances, and it is therefore an object of the invention to provide an unnecessary matter removal method capable of reliably separating and removing an unnecessary matter from a wafer without inflicting damage to the wafer even in the case of separating the unnecessary matter from the wafer by a separation tape.

In order to achieve the above object, the invention employs the following configuration:

A method of joining a separation tape onto a semiconductor wafer and, then, separating the separation tape from the semiconductor wafer, thereby separating an unnecessary matter on the semiconductor wafer together with the separation tape, the method comprising the step of:

separating the separation tape in such a manner that an edge member is brought into contact with a surface of the separation tape joined to the semiconductor wafer and, then, a tip end of the edge member is pressed to the semiconductor wafer at a separation completion end portion where the unnecessary matter is separated from the semiconductor wafer.

According to the method of the invention, the edge member is brought into contact with the surface of the separation tape and, then, is pressed to the wafer at separation completion end portion where the unnecessary matter is separated from the wafer, so that the unnecessary matter can be prevented from being slid in a lateral direction at the time when the unnecessary matter is separated from the wafer.

In addition, the edge member is pressed to the wafer at the separation completion end portion where the unnecessary matter is separated from the wafer, friction between the edge member and the separation tape can be reduced at the time when the separation tape is separated from the wafer. Thus, it is possible to prevent the surface of the wafer from being contaminated and to suppress foreign matters from being generated from the separation tape.

Since the edge member is pressed to the wafer at the separation completion end portion where the unnecessary matter is separated from the wafer, even when bumps are formed on the surface of the wafer, the bumps receives no damage at the time when the separation tape is separated from the wafer. Herein, the separation completion end portion includes a portion on a slightly front side of a portion where the unnecessary matter is completely separated from the wafer. The range of the separation completion end portion varies depending on the size of the unnecessary matter and the like. For example, in the case where the unnecessary matter is a surface protective tape joined onto the surface of the wafer, the separation completion end portion preferably has a range of 10% or less of a wafer diameter from an end portion of the wafer from which the protective tape is completely separated.

Also in the case where the unnecessary matter is a resist film, similar to the case of the protective tape, the separation completion end portion preferably has a range of 10% or less of a wafer diameter from an end portion of the wafer from which the resist film is completely separated.

In addition, since the edge member is used for separation of the separation tape, the separation tape can be pulled in a fixed direction at the time when the separation tape is separated from the wafer, so that separation resistance can be reduced. With this configuration, even when the wafer is thin or even when the unnecessary matter is, for example, a surface protective tape joined onto the surface of the wafer or a resist film formed on the surface of the wafer, the unnecessary matter can be reliably removed from the wafer without inflicting damage to the wafer.

Preferably, a supply speed of the separation tape is made equal to a movement speed of the edge member or the separation tape is supplied with a predetermined tension applied thereto. In other words, the separation tape can be joined onto the wafer so as not to be flexed.

In order to achieve the above object, the invention also employs the following configuration:

The method of the above configuration, further comprising the steps of:

joining the separation tape onto the semiconductor wafer at a separation start end portion where the separation tape is joined onto the semiconductor wafer and, then, is separated from the semiconductor wafer, in such a manner that the tip end of the edge member is pressed to a surface of the separation tape;

releasing the tip end of the edge member from the surface of the separation tape after completion of joining of the separation tape in the previous step; and separating the separation tape to the separation completion end portion in a state of releasing the tip end of the edge member from the surface of the semiconductor wafer, while moving the edge member to join the separation tape onto the semiconductor wafer.

According to the method of the invention, the edge member presses the unnecessary matter and the wafer at the separation start portion where separation resistance is maximum. Consequently, even in the case where the wafer is thin, the separation tape can be separated from the wafer so that the wafer has no load.

In addition, the edge member is brought into contact with the surface of the separation tape and, then, is pressed to the wafer at the separation completion end portion where the unnecessary matter is separated from the wafer, so that the unnecessary matter can be prevented from being slid in a lateral direction and the separation tape can be prevented from being flexed at the time when the unnecessary matter is separated from the wafer.

In addition, the edge member is pressed to the wafer at the separation completion end portion where the unnecessary matter is separated from the wafer, friction between the edge member and the separation tape can be reduced at the time when the separation tape is separated from the wafer. Thus, it is possible to prevent the surface of the wafer from being contaminated and to suppress foreign matters from being generated from the separation tape.

Since the edge member is pressed to the wafer at the separation completion end portion where the unnecessary matter is separated from the wafer, even when bumps are formed on the surface of the wafer, the bumps receives no damage at the time when the separation tape is separated from the wafer. Herein, the separation start end portion includes a predetermined distance from an end portion of the wafer with which the edge member is brought into contact in a movement direction. The range of the separation start end portion varies depending on the size of the unnecessary matter and the like.

In the step of releasing the tip end of the edge member from the wafer, preferably, the separation tape is released from the tip end of the edge member in a state where the tip end of the edge member has a predetermined angle relative to the separation tape. This configuration is effective for suppressing friction with the separation tape at a portion other than the separation start end portion and the separation completion end portion at minimum.

Preferably, a movement speed of the edge member is made slow at the separation start end portion. This configuration makes it possible to reliably join the separation tape from an end portion of the wafer, and to improve a removing efficiency of the unnecessary matter.

In order to achieve the above object, the invention also employs the following configuration:

An apparatus for joining a separation tape onto a semiconductor wafer and, then, separating the separation tape from the semiconductor wafer, thereby separating an unnecessary matter on the semiconductor wafer together with the separation tape, the apparatus comprising:

a transport mechanism for transporting the semiconductor wafer to a predetermined process;

an alignment stage for aligning the semiconductor wafer so that the separation tape is joined onto the semiconductor wafer;

a chuck table for holding the aligned semiconductor wafer;

a tape supply unit for supplying the separation tape toward the held semiconductor wafer;

tape separation means for joining the separation tape to the unnecessary matter on the semiconductor wafer in such a manner that a tip end of an edge member is pressed to a surface of the supplied separation tape and, then, separating the separation tape from the surface of the semiconductor wafer, thereby separating the unnecessary matter together with the separation tape;

a tape collector for collecting the separated unnecessary separation tape; and control means for controlling the separation means so as to join the separation tape to the unnecessary matter at a separation start end portion, where the separation tape is joined onto the semiconductor wafer and, then, is separated from the semiconductor wafer, and a separation completion end portion, in such a manner that the tip end of the edge member of the separation means is pressed to the separation tape, and to release the tip end of the edge member from the separation tape at the other portion.

According to the apparatus of the invention, the edge member is brought into contact with the surface of the separation tape and, then, is pressed to the wafer at the separation completion end portion where the unnecessary matter is separated from the wafer, so that the unnecessary mater can be prevented from being slid in a lateral direction at the time when the unnecessary matter is separated from the wafer.

In addition, the edge member is pressed to the wafer at the separation completion end portion where the unnecessary matter is separated from the wafer, friction between the edge member and the separation tape can be reduced at the time when the separation tape is separated from the wafer. Thus, it is possible to prevent the surface of the wafer from being contaminated and to suppress foreign matters from being generated from the separation tape.

Since the edge member is pressed to the wafer at the separation completion end portion where the unnecessary matter is separated from the wafer, even when bumps are formed on the surface of the wafer, the bumps receives no damage at the time when the separation tape is separated from the wafer.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Hereinafter, description will be given of one embodiment of the invention.

Figure 1:
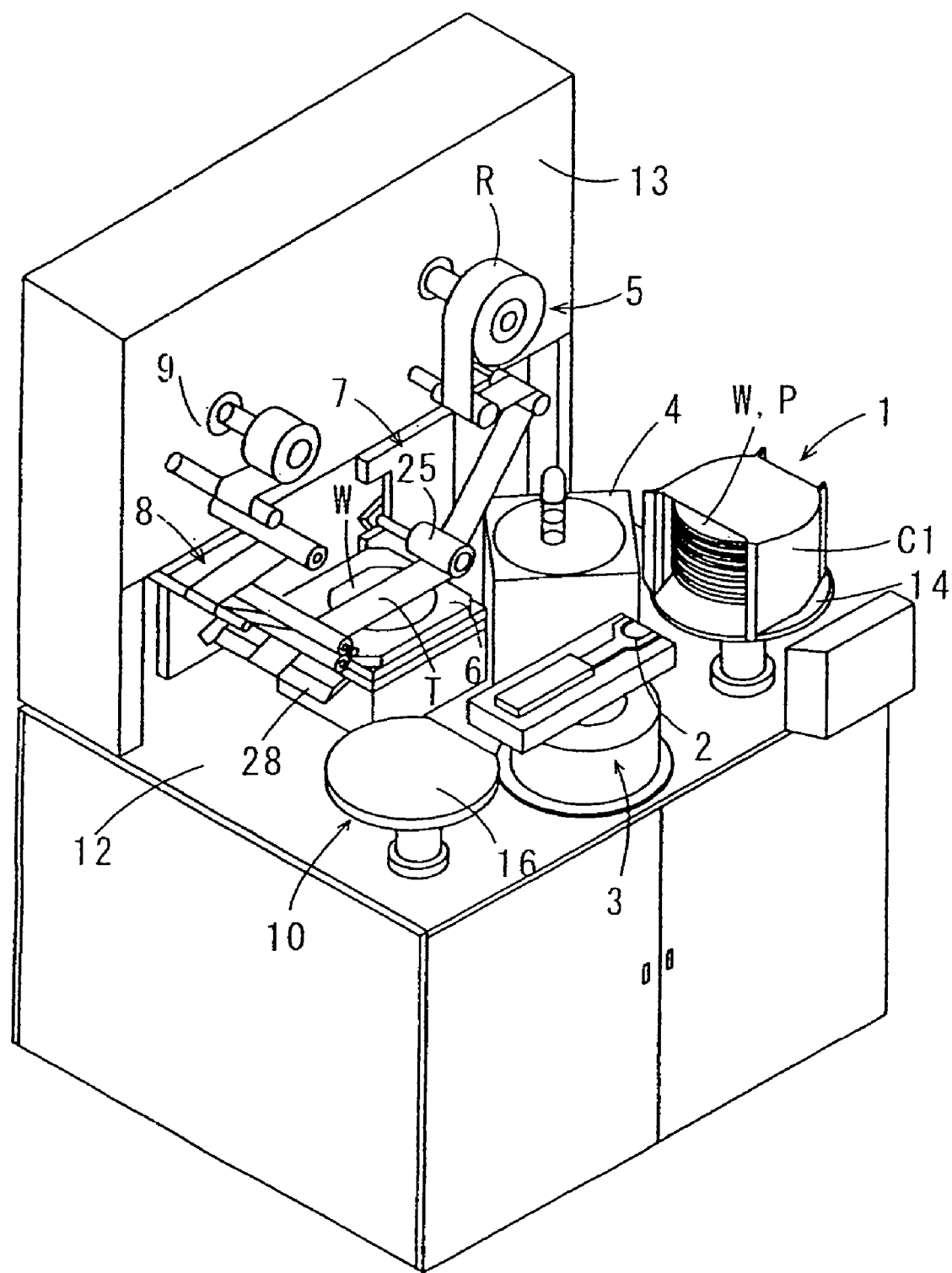
FIG. 1 is an overall perspective view showing a protective tape separation apparatus used for separating a protective tape according to an embodiment of an unnecessary matter removal method of the present invention.
Figure 2:
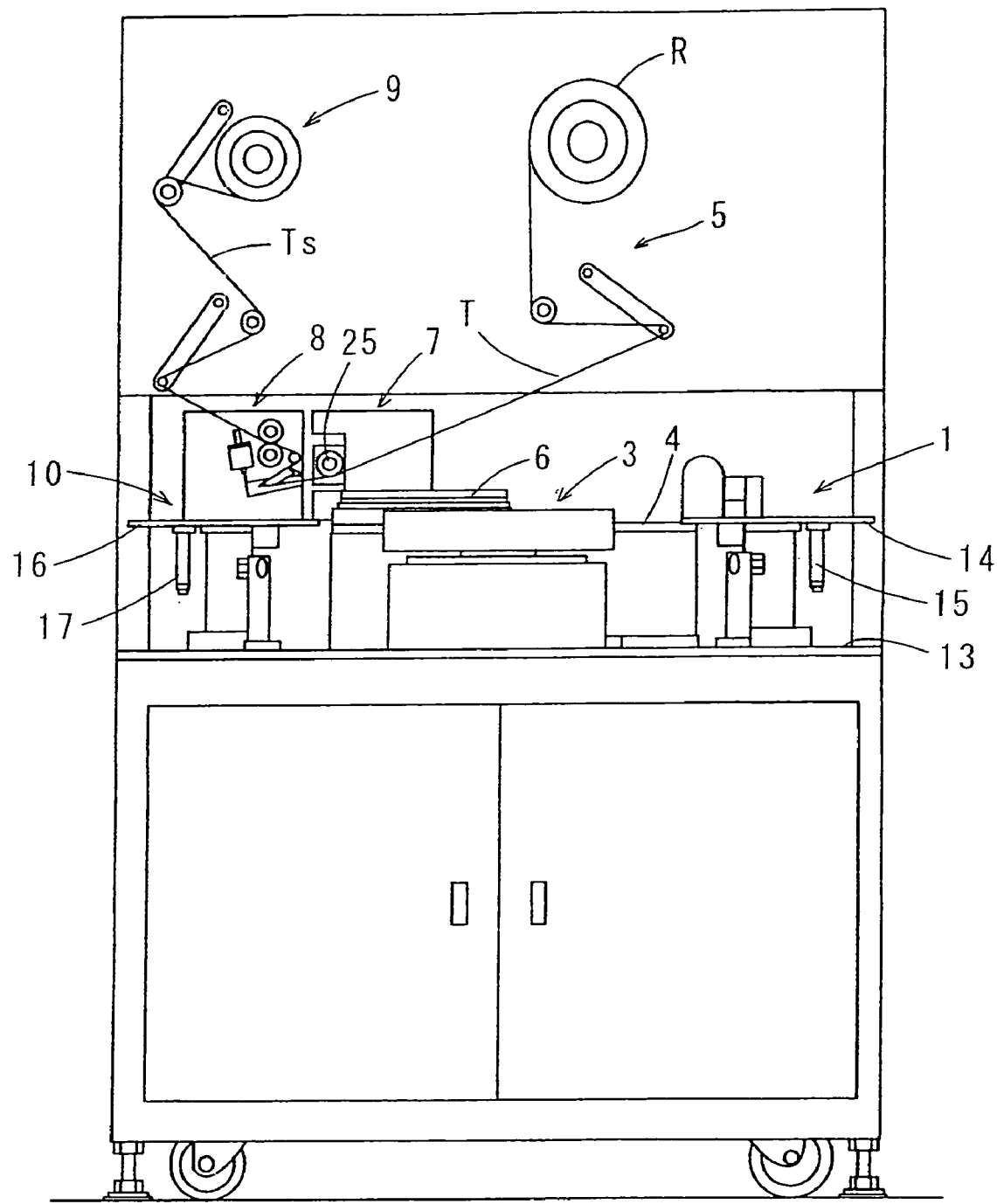
FIG. 2 is an overall front view of the protective tape separation apparatus.
Figure 3:
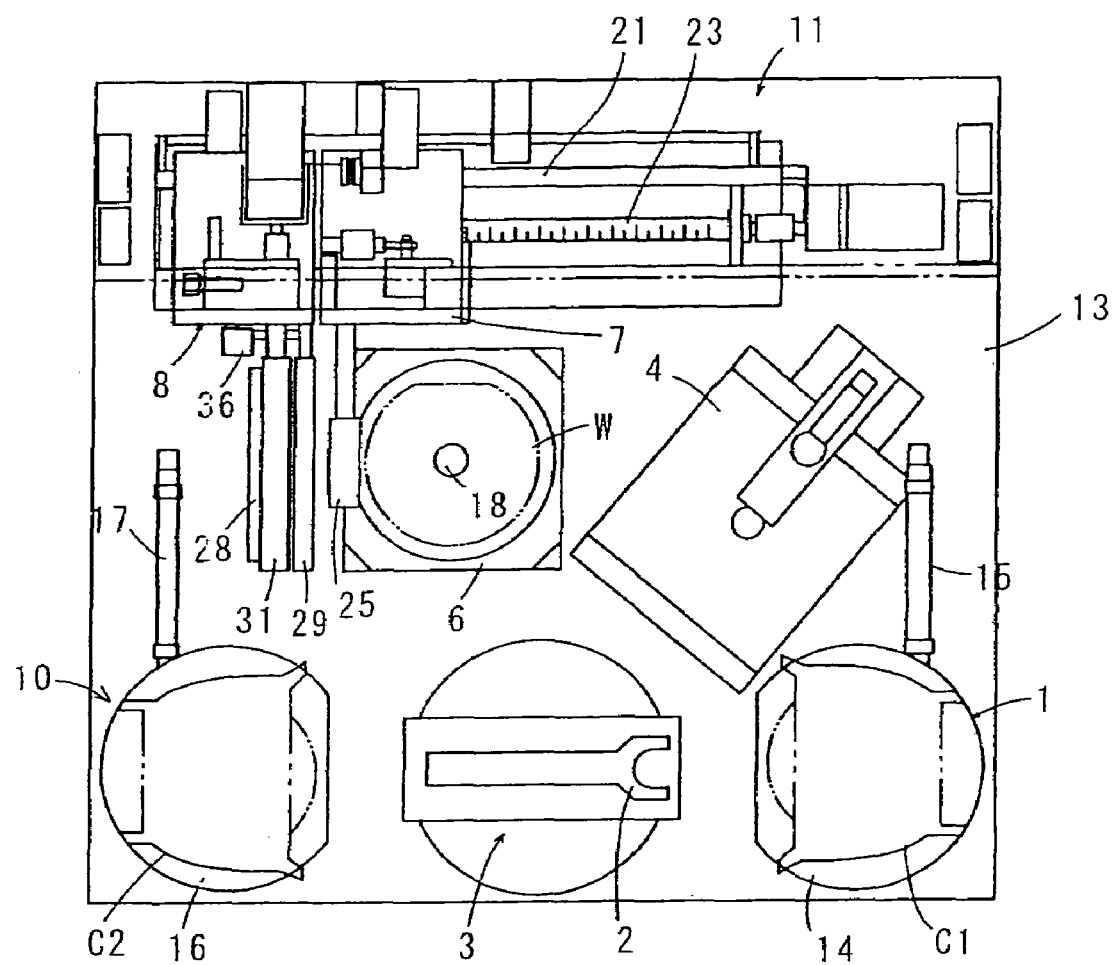
FIG. 3 is an overall plan view showing the protective tape separation apparatus.
Figure 4:
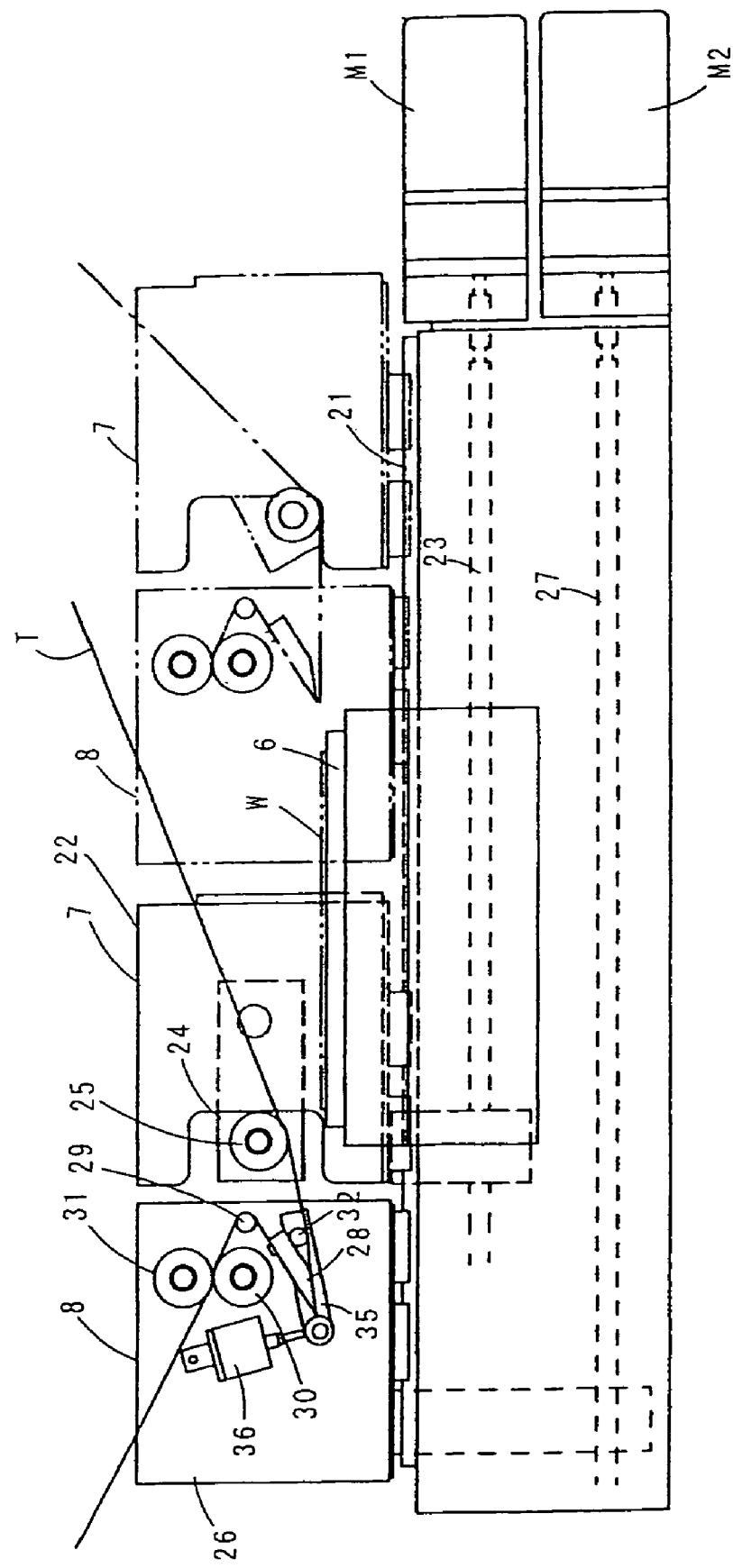
FIG. 4 is a front view showing a tape joining unit and a tape separating unit.
Figure 5:
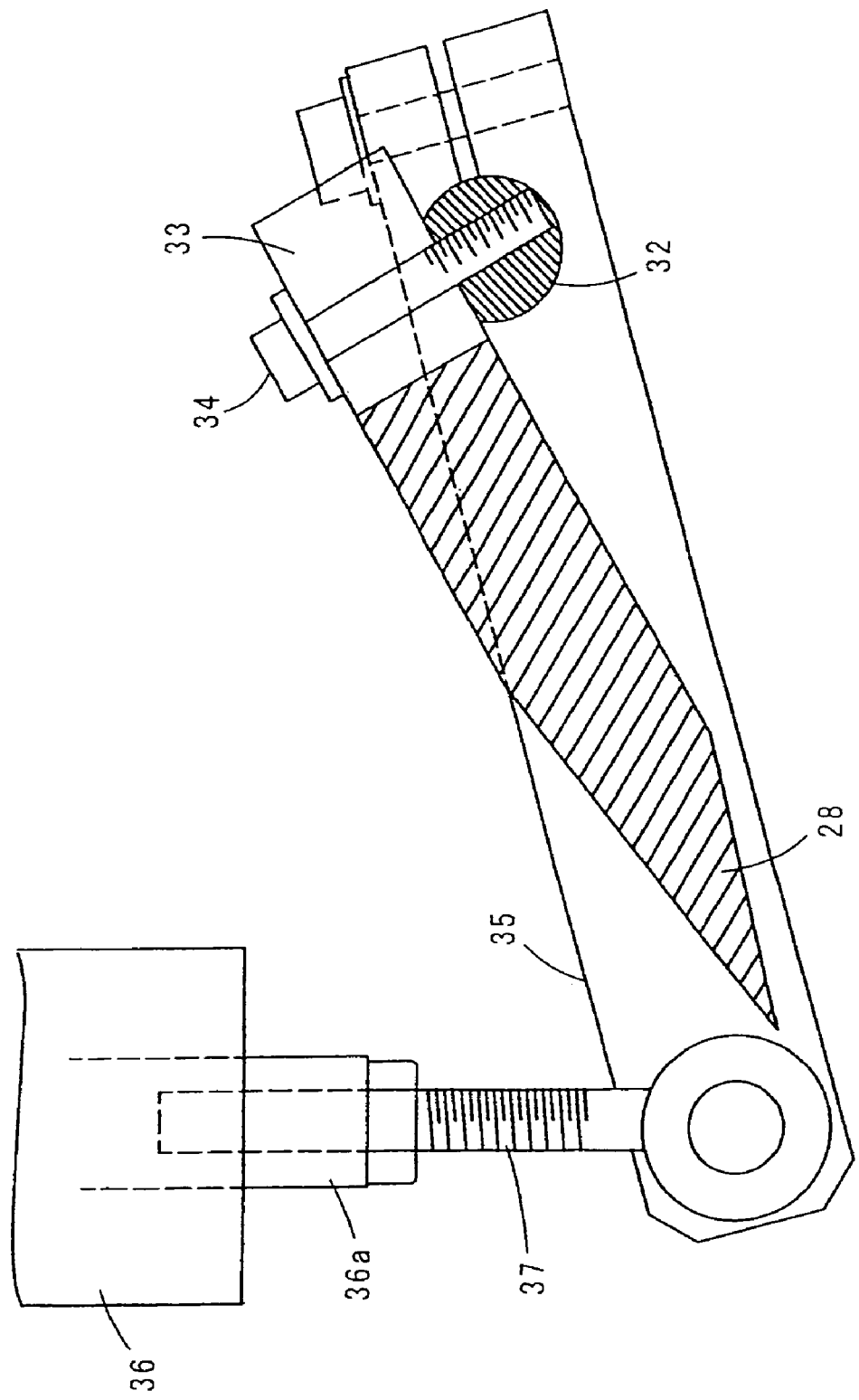
FIG. 5 is a front view showing a support structure of a tape separating edge member.
Figure 6:
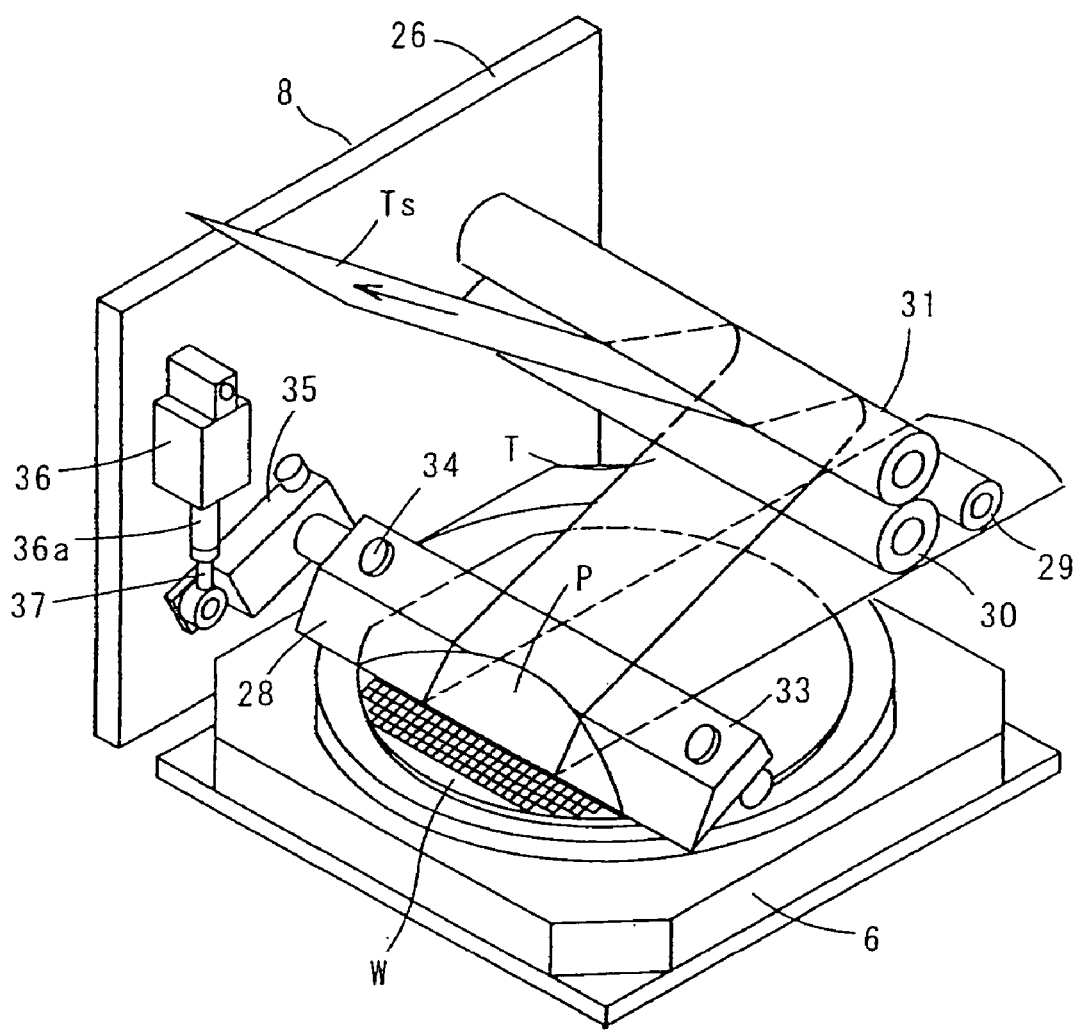
FIG. 6 is a perspective view showing a main part in a tape separating operation state.

An unnecessary matter removal method according to the invention has the following effect: an edge member is pressed to a wafer at a separation completion end portion where an unnecessary matter is separated from the wafer, so that the unnecessary matter can be prevented from being slid in a lateral direction at the time when the unnecessary matters are separated from the wafer. Since edge member is pressed to the wafer at the separation completion end portion where the unnecessary matter is separated from the wafer, friction between the separation tape and the edge member can be minimized at the time when the unnecessary matter is separated from the wafer. As a result, the generation of dust due to the friction between the separation tape and the edge member can be also suppressed. FIG. 1 shows one embodiment of an apparatus used for the unnecessary matter removal method according to the invention. More specifically, FIG. 1 is an overall perspective view showing a protective tape removal apparatus for removing a protective tape joined to a surface of a wafer, which is one example of the unnecessary matter, from the wafer. FIG. 2 is a front view thereof, FIG. 3 is a plan view thereof, FIG. 4 is a front view of a tape joining unit and a tape separating unit, FIG. 5 is a front view showing a support structure of a tape separating edge member, and FIG. 6 is a perspective view showing a main part in a tape separating operation state.

The protective tape removal apparatus according to this embodiment has, on a base 12, a wafer supply unit 1 loaded with a cassette C1 accommodating a stack of wafers W that have been subjected to a back grinding process, a wafer transport mechanism 3 having a robot arm 2, an alignment stage 4 for positioning the wafer W, a tape supply unit 5 for supplying the separation tape T to a separating position, a separation table 6 for suction-holding the wafer W, a tape joining unit 7 for joining the separation tape T to the wafer W on the separation table 6, a tape separating unit 8 for separating the joined separation tape T, a tape collector for collecting the separated separation tape Ts by winding, a wafer collector 10 having a cassette C2 for accommodating a stack of processed wafers W, a unit driver 11 for reciprocating the tape joining unit 7 and the tape separating unit 8 horizontally independently of each other, and the like. The wafer supply unit 1, the wafer transport mechanism 3, the alignment stage 4, the separation table 6 and the wafer collector 10 are arranged on the upper surface of the base 12, whereas the tape supply unit 5 and the tape collector 10 are arranged on the front surface of a vertical wall 13 which erects on the upper surface of the base 12. Also, the tape joining unit 7 and the tape separating unit 8 are arranged at a position facing the lower opening of the vertical wall 13, while the unit driver 11 is arranged on the back of the vertical wall 13.

The wafer supply unit 1 has a configuration in that the wafers W in a horizontal posture with a the surface, to which the protective tape P is joined, directed upward are inserted into the cassette C1 with an appropriate vertical space provided therebetween, and are loaded on the cassette table 14. The cassette table 14 can be arranged in different directions by being revolved by an air cylinder 15. The wafer collector 2 also has a configuration in that the wafers W, that have been subjected to the protective tape separation process, are inserted into the cassette C2 with an appropriate vertical space provided therebetween, and are mounted on the cassette table 16. This cassette table 16 is also changeable in direction by being revolved by an air cylinder 17.

The robot arm 2 of the wafer transport mechanism 3 is configured in a way horizontally retractable and pivotable to take out the wafer W from the wafer supply unit 1, supply the wafer W to the alignment stage 4, convey the wafer W from the alignment stage 4 into the separation table 6, convey the processed wafer W from the separation table 6 and convey the processed wafer W into the wafer collector 10.

The tape supply unit 5 is so configured that the separation tape T supplied from an original roll R is guided to the tape joining unit 7 and the tape separating unit 8 over the separation table 6. The separation tape T has a smaller width than the diameter of the wafer W.

As shown in FIG. 3, a suction pad 18 with the upper surface thereof constituting a vacuum suction surface is arranged vertically retractibly at the center of the separation table 6. The upper surface of the table is configured as a vacuum suction surface to hold the wafer W without displacement.

As shown in FIG. 4, a movable table 22 horizontally movably supported along a rail 21 is reciprocated by the tape joining unit 7 horizontally at a predetermined stroke by a feed screw 23 adapted to be driven in forward and reverse directions by a motor M1. A joining roller 25 is mounted on the movable table 22 vertically movably through a swingable arm 24.

The tape separating unit 8 is also so configured that a movable table 26 supported horizontally movably along the rail 21 is reciprocated horizontally at a predetermined stroke by a feed screw 27 driven in forward and reverse directions by a motor M2. The movable table 26 has mounted thereon a tape separating edge member 28, a guide roller 29, a supply roller 30 adapted to be rotated, and a holding roller 31 arranged in opposed relation to the supply roller 30.

As shown in FIGS. 5 and 6, the tape separating edge member 28 has a sharp tip end. The edge member 28 is configured of a plate member wider than the diameter of the wafer, and is fixedly connected, retractibly through the slit 33 and the bolt 34, to a rotary shaft 32 projected and supported rotatably on the front surface of the movable table 26. An operating arm 35 is fastened and connected at the base of the rotary shaft 32. A connection rod pivotally connected to the free end of the operating arm 35 is connected to a piston rod 36a of an air cylinder 36 mounted on the front surface of the movable table 26. Specifically, the rotary shaft 32 is rotated by the swinging motion of the operating arm 35 with the retractive operation of the piston rod. With this configuration, the tip end of the edge member 28 is moved vertically.

The connection rod 37 extended from the free end of the operating arm 35 is screwed into the piston rod 36a of the air cylinder 36. Specifically, by adjusting the amount in which the connection rod 37 is screwed, the swinging angle of the operating arm 35 with the piston rod 36a projected to the stroke end, i.e., the angle of the edge member 28 at the lowest position can be adjusted as desired.

Each part of the protective tape separation apparatus according to this embodiment is configured as described above. The basic process of separating the protective tape P joined on the surface of the wafer W will be described with reference to FIGS. 7 to 14.

First, the robot arm 2 suction-holds and takes out one wafer W from the cassette C1 of the wafer supply unit 1 and places it on the alignment stage 4. Based on the detection of the orientation flat and the notch of the wafer W, the wafer W is positioned. The wafer W thus positioned is again transported by being supported on the robot arm 2 and supplied onto the separation table 6.

Figure 7:
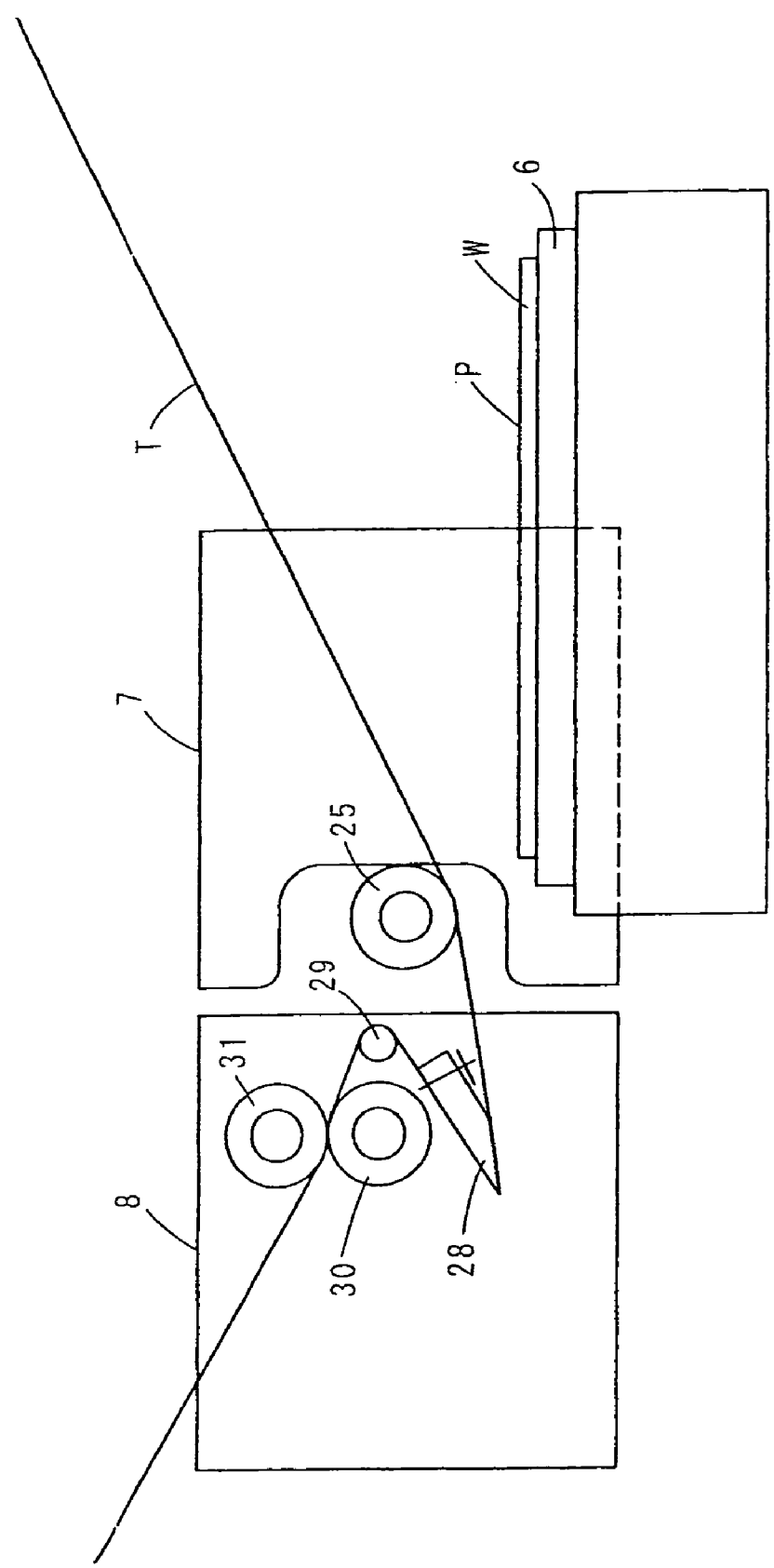
FIGS. 7 to 13 are front views each illustrating a tape separating step.

The wafer W conveyed onto the separation table 6 is received by a suction pad 18 projected from the table and placed in a predetermined posture on the upper surface of the separation table 6 with the downward movement of the suction pad 18. The wafer W is thus suction-held with the surface, to which the protective tape P is joined, directed upward. In the process, as shown in FIG. 7, the tape joining unit 7 and the tape separating unit 8 are located in a standby position at some distance behind the separation table 6.

Figure 8:
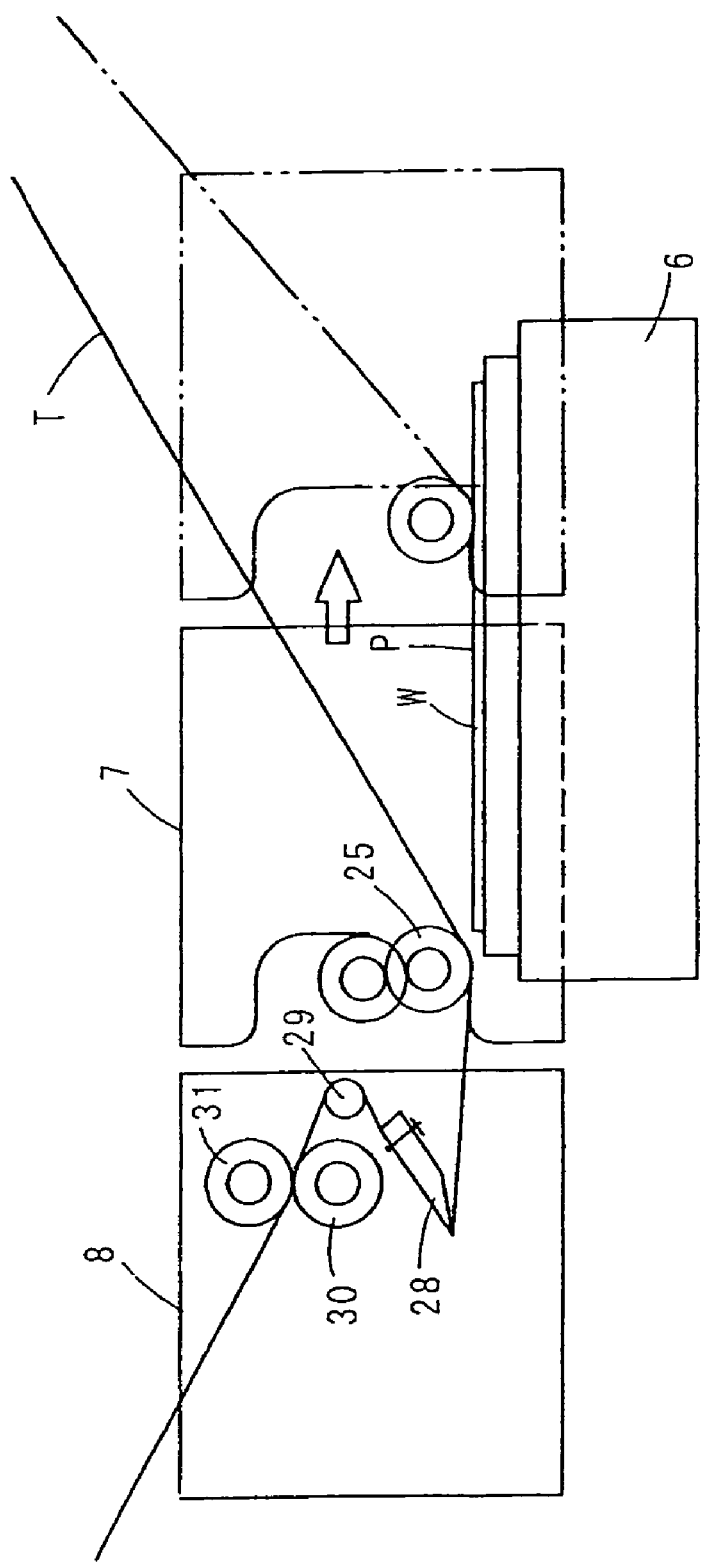

As shown in FIG. 8, when the wafer W is placed on the separation table 6, the joining roller 25 of the tape joining unit 7 moves down to a predetermined joining level, where the whole unit moves forward and the joining roller 25 rolls over the wafer W. In this way, the separation tape T is joined onto the surface of the protective tape P.

Figure 9:
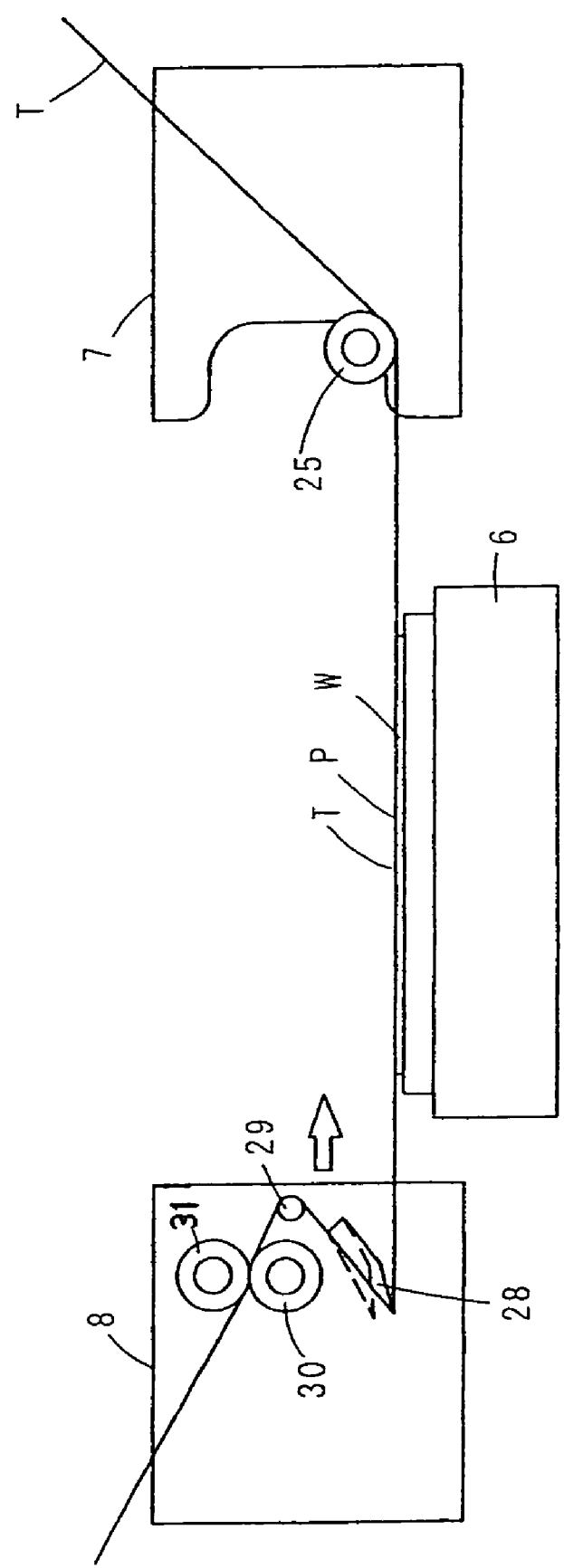

As shown in FIG. 9, upon completion of joining of the separation tape T, the air cylinder 36 of the tape separating unit 8 is projected to the stroke end and the edge member 28 moves down to the lower limit by the swing motion of the operating arm 35.

Figure 10:
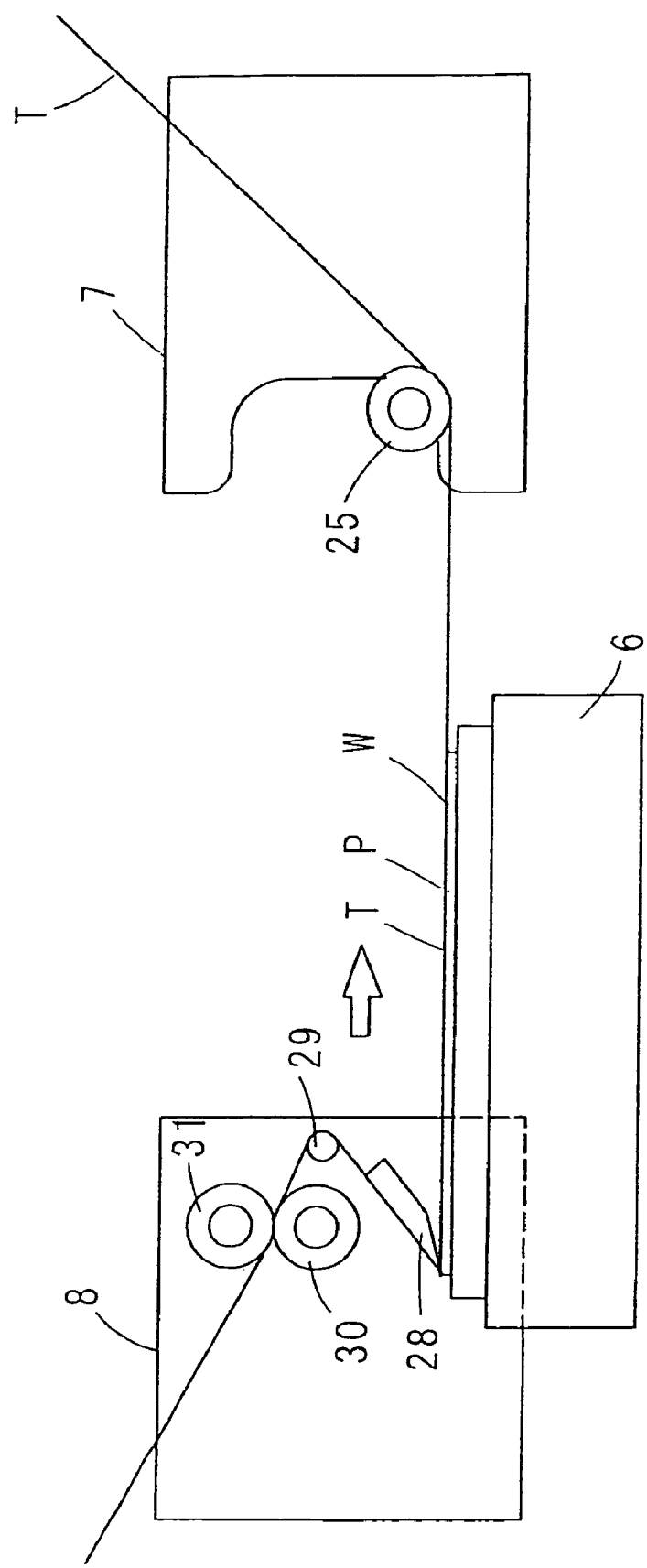

Next, as shown in FIG. 10, the tape separating unit 8 is moved forward. At the same time, the separation tape T is supplied by the supply roller 30 at a peripheral speed in synchronism with the movement speed of the tape separating unit 8. The separation tape T folded back and guided at a predetermined angle at the tip end of the edge member 28 is guided between the supply roller 30 and the holding roller 31 through a guide roller 29. Once the tip end of the edge member 28 reaches the end of the wafer W, i.e., the separation start end portion of the protective tape P which is an unnecessary matter, the tip end of the edge member 28 moves up while maintaining the same angle. In this way, the protective tape P and the wafer W are held by the edge member 28 at the separation start end portion where the separation resistance is maximum. Even in the case where the wafer W is thin, the separation tape T can be separated without imposing any load on the wafer W.

Figure 11:
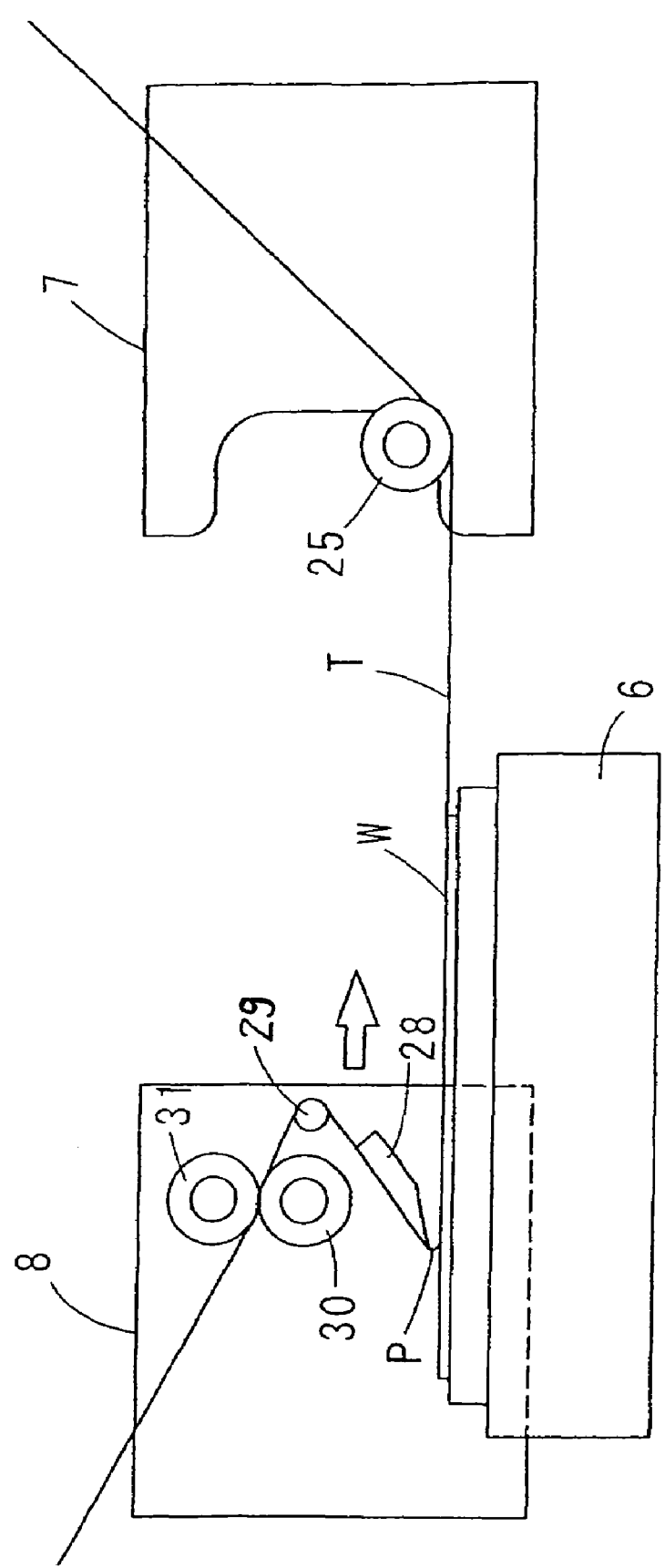

As shown in FIG. 11, the tape separating unit 8 with the edge member 28 moved up moves forward integrally with the protective tape P joined thereto, so that the protective tape P is separated from the surface of the wafer W. In this way, the wafer surface is not pressed by the tip end of the edge member 28 during the movement; therefore, the friction is reduced between the separation tape T and the edge member 28. As a result, the dust otherwise caused by the friction between the separation tape T and the edge member 28 is not generated. Also, even in the case where irregularities such as bumps are formed on the surface of the wafer W, the separation tape T can be separated without inflicting damage to the wafer W.

In this case, the edge member 28 moves forward at a lower speed when the protective tape P starts to be separated as the edge member 28 passes through the end of the wafer W and at a higher speed subsequently to improve the processing efficiency. Also, the supply roller 30 is rotated by a driver (not shown) through a slip clutch adapted to slip under a predetermined or higher torque, so that the separation tape T is supplied with a predetermined tension applied thereto.

Figure 12:
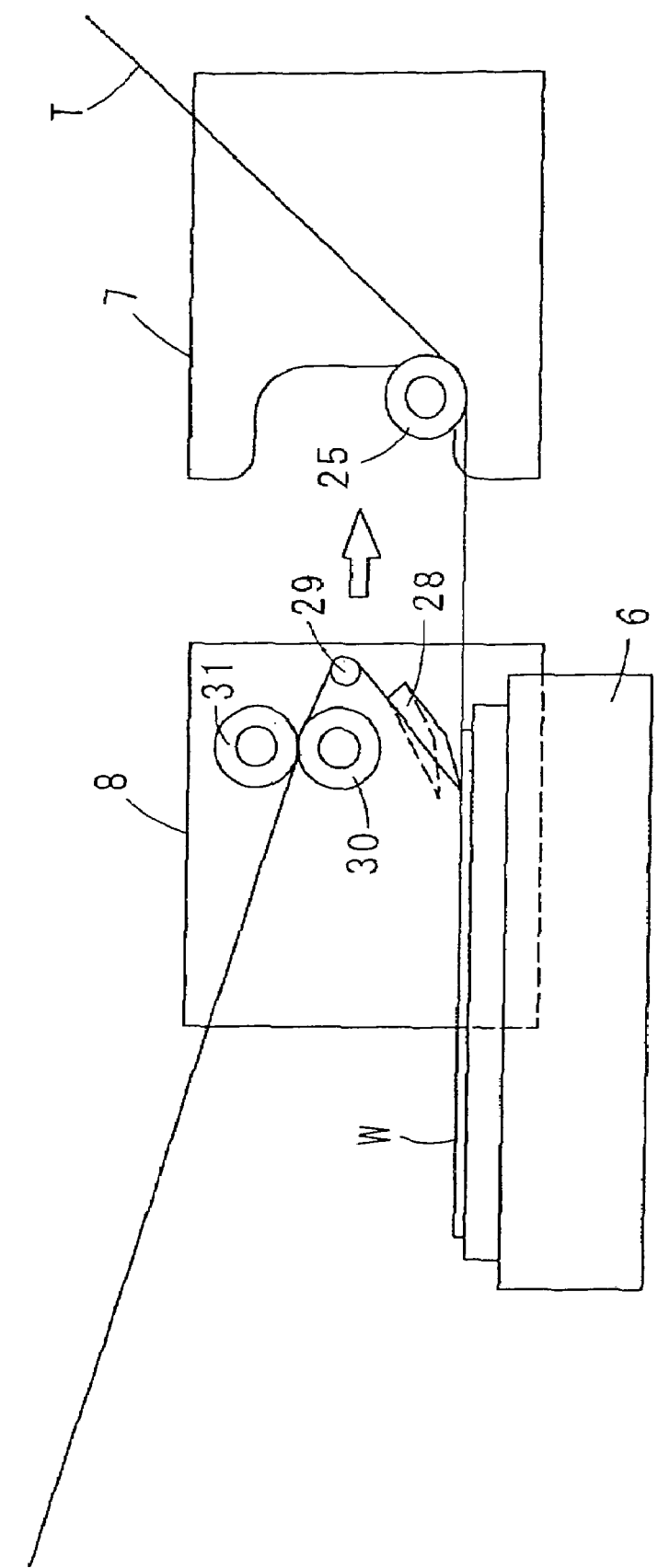

As shown in FIG. 12, the edge member 28, with the arrival at the separation completion end portion where the protective tape P is separated from the wafer W, moves down again and the tip end thereof presses the separation tape T to the wafer W. As a result, the protective tape P can be prevented from being slid in a lateral direction at the time when the protective tape P is separated from the wafer W. Thus, the adhesive or the like of the protective tape P can be prevented from coming in contact with the surface of the wafer W when the protective P is separated.

Figure 13:
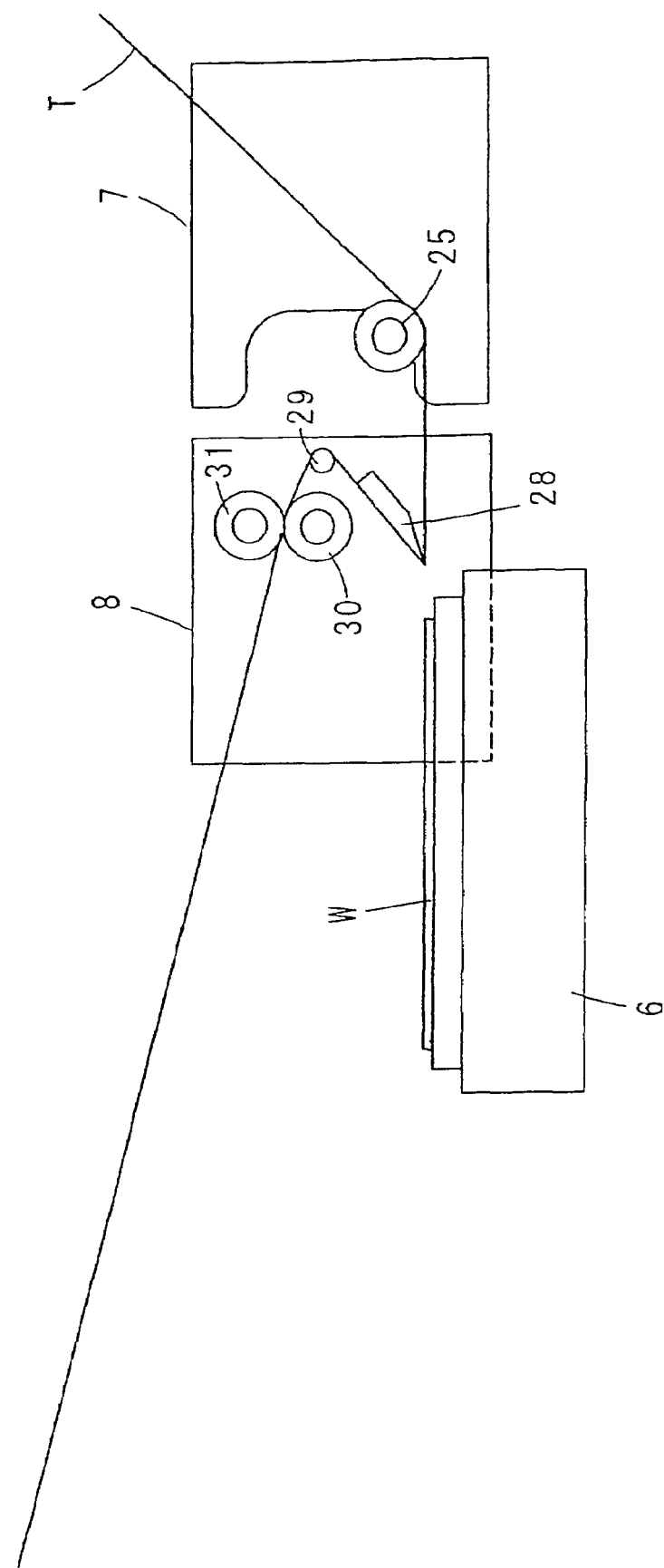

As shown in FIG. 13, upon complete separation of the protective tape P with the tape separating unit 8 passing above the wafer, the wafer W is transported from the separation table 6 by the robot arm 2 and accommodated by being inserted into the cassette C2 of the wafer collector 10. After that, the tape joining unit 7 and the tape separating unit 8 are moved and restored into the original standby position, and the separation tape Ts separated is wound and collected. Also, the joining roller 25 and the edge member 28 are moved up to the original standby position.

One procedure of the protective tape separation process is thus completed, and the next wafer receiving phase is entered. The operation of moving up and down and the movement speed of the edge member 28 are centrally controlled by a control unit not shown.

Figure 14:
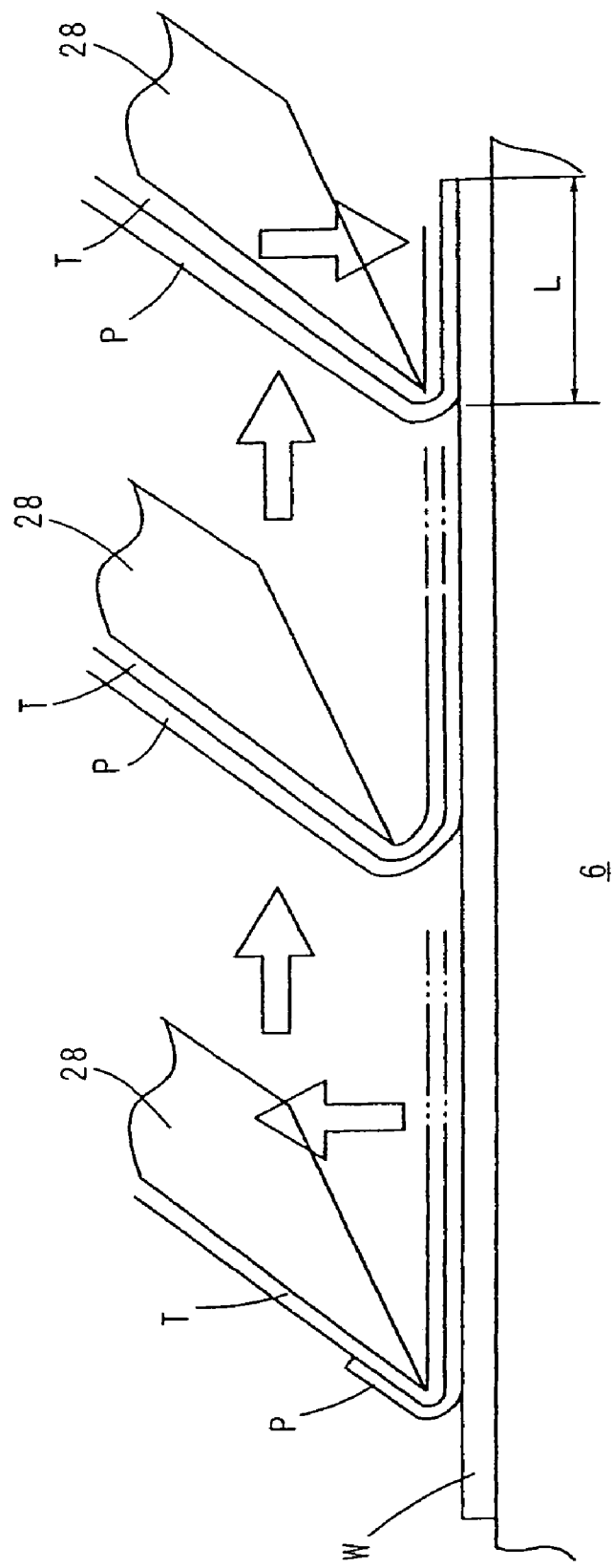
FIG. 14 is an enlarged front view showing a main part in the tape separating step.

FIG. 14 schematically shows, in enlarged form, a series of the process described above. As shown in FIG. 14, while the separation tape T is separated, the edge member 28 is moved up from the wafer W. At the separation completion end portion L where the unnecessary matter such as the protective tape P is separated from the wafer W, the tip end of the edge member 28 is pressed to the wafer W thereby to prevent the unnecessary matter such as the protective tape P from being slid in a lateral direction when completely separated from the wafer. In the case where the unnecessary matter is the protective tape P for protecting the surface of the wafer W, the separation completion end portion L is preferably within a range 10% or less of the diameter of the wafer W. As a result, the slide of the protective tape P in a lateral direction at the time of separation can be prevented reliably. Also, the friction between the tip end of the edge member 28 and the separation tape T is reduced at the time of separation. Thus, the dust constituting foreign matters can be prevented from being generated from the separation tape T by the friction. The embodiments described above deal with the protective tape joined to the wafer surface as an unnecessary matter. Nevertheless, the unnecessary matter to be removed according to the invention also include a resist film used for forming a pattern on the wafer surface.

In the case where the unnecessary matter is a resist film, the separation tape, after being joined directly onto the resist film, is separated by a similar method. In this way, the resist film can be reliably removed from the wafer surface together with the separation tape.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method of joining a separation tape onto a semiconductor wafer and, then, separating the separation tape from the semiconductor wafer, thereby separating an unnecessary matter on the semiconductor wafer together with the separation tape, the method comprising the steps of:

providing an edge member having a tip end;

joining the separation tape onto the semiconductor wafer at a separation start end portion where the separation tape is joined onto the semiconductor wafer and, then, is separated from the semiconductor wafer, in such a manner that the tip end of the edge member is pressed to a surface of the separation tape thereby pressing the semiconductor wafer;

releasing the tip end of the edge member from the surface of the separation tape after completion of joining of the separation tape in the previous step thereby relieving the pressing of the semiconductor wafer; and separating the separation tape to a separation completion end portion in a state of releasing the tip end of the edge member from the surface of the semiconductor wafer and, then, the tip end of the edge member is pressed to the semiconductor wafer at the separation completion end portion where the unnecessary matter is separated from semiconductor wafer.

2. The method of claim 1, wherein
in the step of releasing the tip end of the edge member from the surface of the semiconductor wafer, the tip end of the edge member is released from the surface of the separation tape in a state where the tip end of the edge member has a predetermined angle relative to the surface of the separation tape.

3. The method of claim 1, wherein
a movement speed of the edge member is made slow at the separation start end portion.

4. The method of claim 1, wherein
a supply speed of the separation tape is equal to the movement speed of the edge member.

5. The method of claim 1, wherein
the separation tape is supplied with a predetermined tension being applied thereto.

6. The method of claim 1, wherein
a joined length of the separation tape at the separation completion end portion is equal to or less than 10% of a diameter of the semiconductor wafer.

7. The method of claim 1, wherein
the unnecessary matter is a surface protective tape joined onto the surface of the semiconductor wafer.

8. The method of claim 1, wherein
the unnecessary matter is a resist film formed on the surface of the semiconductor wafer.

9. A method of removing a protective tape adhering to a surface of a semiconductor wafer, comprising the steps of:

applying a separation tape to the protective tape such that the separation tape extends from a leading end of the semiconductor wafer to a trailing end of the semiconductor wafer;

providing a tape separating unit having an edge member with a tip end, the tape separating unit being disposed apart from the protective tape and the semiconductor wafer in a non-contacting stand-by state adjacent the leading end, the separating tape being in slidable contact with the tip end of the edge member; and moving the tape separating unit across the protective tape and semiconductor wafer while the tape separating unit takes up the separating tape, wherein, as the tape separating unit moves and reaches the leading end of the semiconductor wafer, the tip end of the edge member is pressed onto the protective tape and the semiconductor wafer with the separation tape is disposed between the tip end and the protective tape, after the tape separating units moves past the leading end, the tip end of the edge member is lifted such that the tip end is relieved of pressing the semiconductor wafer through the separation tape and the protective tape as the tape separating unit continues to move across the semiconductor wafer and the separation tape adheres to the protective tape, and as the tip end of the edge member approaches the trailing end of the semiconductor wafer, the tip end of the edge member is pressed onto the protective tape and the semiconductor wafer with the separation tape being disposed between the tip end and the protective tape until the tip end moves beyond the trailing edge thereby removing the entirety of the protective tape from the semiconductor wafer as the protective tape adheres to the separation tape and as the separation tape is taken up by the tape separation unit.

\* \* \* \* \*